US012232293B2

(12) United States Patent
Levitan et al.

(10) Patent No.: US 12,232,293 B2
(45) Date of Patent: Feb. 18, 2025

(54) MULTIPLE CHASSIS COOLING ZONES

(71) Applicant: Arista Networks, Inc., Santa Clara, CA (US)

(72) Inventors: Aaron Gregory Levitan, Berkeley, CA (US); Vincent Cridlig, San Francisco, CA (US); Yury Murashka, Dublin (IE); Matthew Gawlowski, Woodland Park, CO (US); Paulmer Soderberg, Santa Clara, CA (US)

(73) Assignee: ARISTA NETWORKS, INC., Santa Clara, CA (US)

( * ) Notice: Subject to any disclaimer, the term of this patent is extended or adjusted under 35 U.S.C. 154(b) by 232 days.

(21) Appl. No.: 17/686,351

(22) Filed: Mar. 3, 2022

(65) Prior Publication Data

US 2023/0284411 A1    Sep. 7, 2023

(51) Int. Cl.
*H05K 7/20* (2006.01)

(52) U.S. Cl.
CPC ..... *H05K 7/20145* (2013.01); *H05K 7/20172* (2013.01); *H05K 7/20209* (2013.01)

(58) Field of Classification Search
CPC ........... H05K 7/20145; H05K 7/20172; H05K 7/20727; H05K 7/20736; H05K 7/20209; H05K 7/20572; H05K 7/20909; G06F 1/20; G06F 1/206
USPC ........................................................ 361/695
See application file for complete search history.

(56) References Cited

U.S. PATENT DOCUMENTS

| | | | | |
|---|---|---|---|---|
| 5,813,243 | A * | 9/1998 | Johnson | G06F 1/20 361/678 |
| 6,563,706 | B1 * | 5/2003 | Strickler | H05K 7/20718 165/122 |
| 2006/0044753 | A1 * | 3/2006 | Wong | H05K 7/20909 361/695 |
| 2007/0133167 | A1 * | 6/2007 | Wagner | H05K 7/20727 361/679.48 |
| 2010/0218920 | A1 * | 9/2010 | Vaananen | H05K 7/20581 29/890.035 |
| 2011/0149513 | A1 * | 6/2011 | Silvennoinen | H05K 7/20172 361/695 |
| 2015/0016059 | A1 * | 1/2015 | Esmaily | H05K 7/20145 361/695 |
| 2017/0102747 | A1 * | 4/2017 | Ragupathi | H05K 7/20736 |
| 2017/0285698 | A1 * | 10/2017 | Kobayashi | G11B 33/128 |
| 2017/0310363 | A1 * | 10/2017 | Liu | H05K 7/1492 |

\* cited by examiner

*Primary Examiner* — Mandeep S Buttar
(74) *Attorney, Agent, or Firm* — Fountainhead Law Group, PC

(57) ABSTRACT

A network switch device includes cooling fans to remove heat generated by its electronic circuitry during operation. Multiple cooling zones are provided in a network switch device to enable reduced cooling fan power consumption. The switch device includes a baffle positioned between a first zone and a second zone and across a circuit board. A first cooling fan provides a first airflow through the first zone and across a first portion of the circuit board positioned within the first zone. A second cooling fan provides a second airflow through a second zone of the housing and across a second portion of the circuit board positioned within the second zone. The baffle directs the first airflow away from the second zone and directs the second airflow away from the first zone. Fan speeds of fans in a cooling zone may be adjusted based on temperature sensors positioned in that zone.

17 Claims, 8 Drawing Sheets

MULTIPLE CHASSIS COOLING ZONES

BACKGROUND

The present disclosure pertains to computer network switch devices and in particular to cooling of computer network switch devices.

A network switch device is a computer device that can connect other computer devices over a computer network. Network switch devices may include cooling fans to remove heat generated by its electronic circuitry during operation. Operation of cooling fans uses electric power. There is a need for improved cooling and power-consumption efficiency for network switch devices.

The present disclosure addresses these issues and others, as further described below.

DETAILED DESCRIPTION

Figure 1:
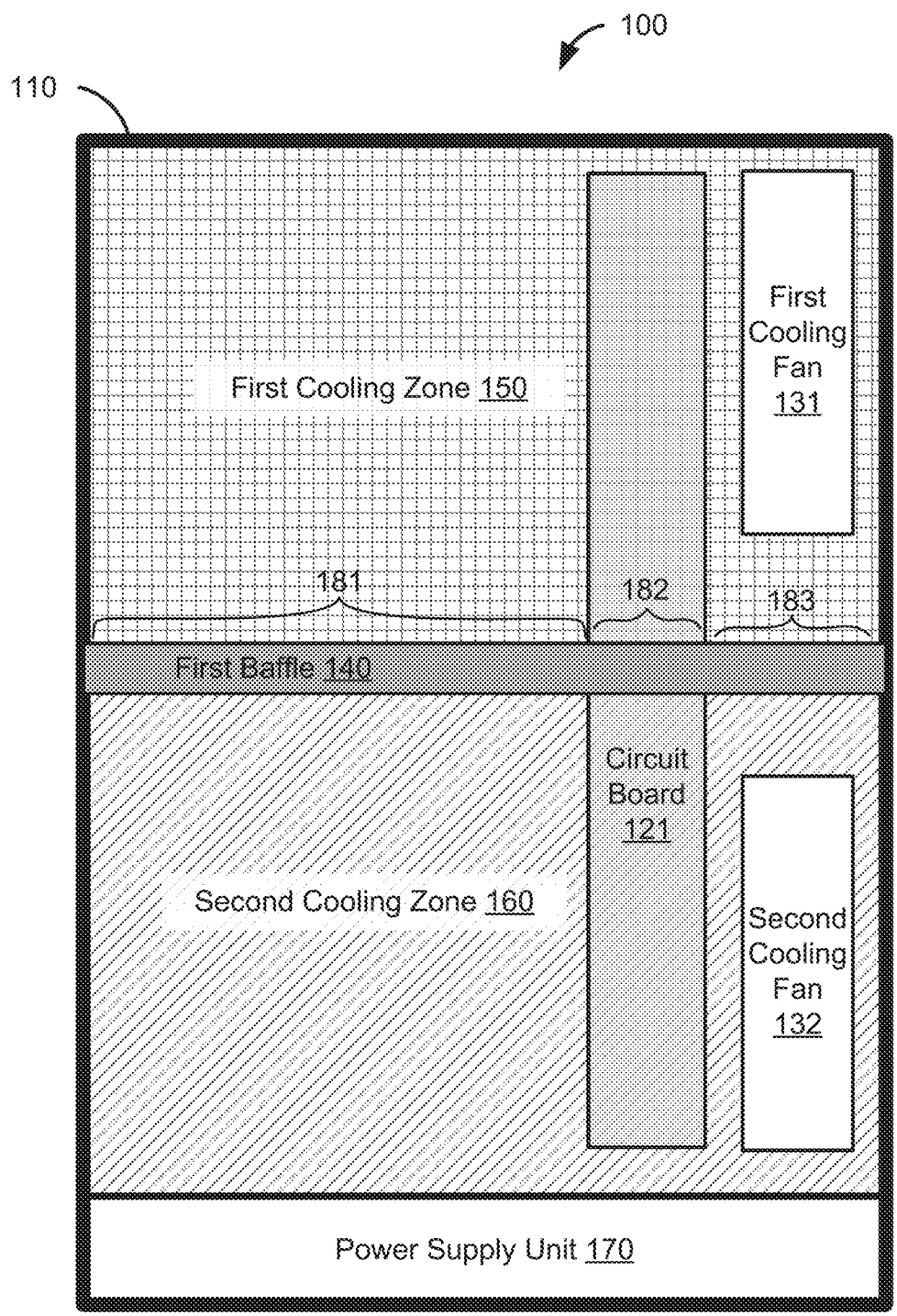
FIG. 1 shows a diagram of a network switch device including a baffle positioned across a circuit board and between a first cooling zone and a second cooling zone, according to an embodiment.

Network switch devices may include cooling fans to remove heat generated by its electronic circuitry during operation. For example, a fabric card of a network switch may include one or more fans that provide cooling of the fabric card itself and one or more supervisor cards or line cards. Some switch devices also have power supply units with built-in fans. The built-in fans of the power supply units may be set and adjusted separately from the fabric card fans.

Certain prior network switch devices operate all fabric card fans at the same speed. This technique might ensure that the hottest card components are cooled but may waste power by running some fans unnecessarily fast. For instance, some network switch devices may have a card or components of a card that run hotter than other cards or other card components (e.g., high-power cards may run hotter than low-power cards). In such situations, running all of the card-cooling fans at the same speed to cool the hotter card or component may cause power to be wasted by the fans cooling less-hot cards or components. Certain prior network switch devices may enable a user to manually set fan speeds of fabric-card fans but do not provide for groups fans to be adjusted automatically based on temperature readings. Certain prior network switch devices do not provide baffles between groups of line cards, or across line cards, as described below. It would be advantageous to optimize fan speeds and the cooling for power-saving and environmental reasons. Furthermore, reduced cooling fan power consumption also means that fan speeds are reduced, thereby reducing wear and tear of the fan's components. Accordingly, there is a need for improved cooling and power-consumption efficiency for network switch devices.

The present disclosure provides for multiple cooling zones for a network switch device that optimize cooling and power-consumption. A "cooling zone" as used herein refers to a particular area within a network switch chassis that is cooled by a particular set of one or more cooling fans. A network switch device may have multiple cooling zones where the cooling zones are physically separated (e.g., by one or more baffles) and where each cooling zone is cooled by a different set of cooling fans. The term "cooling zone" may also refer to the cards, components, and fans that cool an area of the cooling zone as well as the fan speed configuration of the fans, depending on the context.

As further described below, the card slots of a network switch device chassis may be divided into multiple "cooling zones" which may be cooled by separate and distinct sets of fans (e.g., fabric card fans). In some embodiments, each fabric card spans multiple cooling zones and each cooling zone spans multiple line card slots. In some embodiments, each fabric card has multiple fans where a first subset of fans operates to cool a first cooling zone and a separate second set of fans operates to cool a second cooling zone. In some embodiments, the first and second cooling zones are separated by baffles mounted on the chassis and/or mounted on the fabric cards. In some embodiments the baffles may be field replaceable (e.g., the may be mounted to a housing of the chassis in a non-permanent fashion). The baffles direct the airflow (created by operating the fans) such that it flows through the slots corresponding to particular cooling zones (e.g., upper fans may cool upper slots while lower fans may cool lower slots). Further description of the cooling zones is provided below. The baffles may also restrain the airflow from flowing through card slots corresponding to other cooling zones. The baffle may or may not create an airtight seal. In some embodiments, 10-20% of airflow may leak past the baffle. However, overall power consumption for cooling multiple cooling zones may still be reduced, even with 10-20% or more leakage.

Features and advantages of providing cooling zones in a network switch device using baffles and automatic fan speed control per cooling zone include decreased fan power consumption and reduced fan wear and tear compared to prior network switch devices.

In some embodiments, one or more of the line cards and/or one or more of the fabric cards in a chassis include at least one temperature sensor which may be monitored by software (e.g., by software of an operating system run by a supervisor card). The software may adjust the fan speed corresponding to the cooling zone based on the temperature readings of the temperature sensors in that cooling zone, thereby reducing power consumption. The software may adjust the fan speed for the different cooling zones to account for changes in network traffic, which may cause certain line cards to heat up more than others. In cases where certain card slots are empty or there are lower-power cards in a slot, the fans of that cooling zone may be set to run slower, using less power.

The network switch device may store a mapping of which card slots and/or which temperature sensors are located in each cooling zone. For example, the network switch device may store a mapping that maps each line card slot to a particular cooling zone and a mapping that maps each temperature sensor of a fabric card to a particular cooling zone.

In one example of a cooling zone, a network switch device may support cooling zones for groups of four adjacent line card slots. The fan speed of the fans positioned behind each group of four line card slots may be adjusted separately from the fans cooling other groups of line card slots. This allows the network switch device to adequately cool hotter cards by increasing the speed of a subset of the fans. The fans in the other cooling zones having less-hot cards can run at a slower speed, thereby reducing overall power consumption. For example, a first group of four line card slots may have four operating line cards while a second group of four line card slots may have two operating line cards. The four line cards of the first group may provide more heat than the two line cards of the second group and so fans cooling the first group may be operated at a higher speed (using more power) while fans cooling the second group are operated at a comparatively lower fan speed.

In this example, temperature values may be read from temperature sensors of the line cards operating in each group and the fan speed of the fans cooling those line cards may be set based on the temperature values, separate from the speed of other fans within the network switch device chassis. The temperature readings from the temperature sensors may be monitored over time (e.g., periodically) and the fan speed of each cooling zone may be adjusted accordingly. Accordingly, the fan speeds of the cooling zones may be changed to account for changes in network traffic volume, which may cause certain components of the network switch device to produce more or less heat.

Baffles are provided in order to separate the airflows of the cooling zones by directing or funneling airflow towards particular cooling zones. Referring to the example above, a baffle may be provided between a first group of four adjacent line card slots and a second group of four adjacent line card slots such that airflow from a first fan cooling the first group is directed, by the baffle, away from the second group and airflow from a second fan cooling the second group is directed, by the baffle, away from the first group.

Different configurations of cooling zones within various network switch device chassis are described in further detail below.

FIG. 1 shows a diagram of network switch device 100 including a first baffle 140 positioned across a circuit board 121 and between a first cooling zone 150 and a second cooling zone 160, according to an embodiment. The network switch device 100 includes a housing 110, a circuit board 121, a first cooling fan 131, a second cooling fan 132, and a power supply unit 170. The network switch device 100 may further include other cooling fans in some embodiments. In some embodiments the network switch device 100 may include other circuit boards (e.g., supervisor cards, line cards, or fabric cards). The components in FIG. 1 are positioned and dimensions for simplicity of illustrating cooling zones and these components may be positioned and dimensioned differently in other embodiments consistent with the description below.

The network switch device 100 may be a network switch device configured to connect other computer devices over a computer network. The network switch device 100 may include additional components for operating and performing networking functionality that are not shown in FIG. 1 for simplicity of illustration.

The first circuit board 121 is positioned within the housing 110. In some embodiments the first circuit board 121 may be a fabric card. In some embodiments the first circuit board 121 may be a line card. In some embodiments the circuit board 121 may be a supervisor card. In other embodiments the circuit board 121 may be a different type of circuit board with different functionality. In some embodiments the first cooling fan 131 and the second cooling fan 132 may be electrically coupled to the first circuit board 121. The first circuit board 121 may be configured to control a first fan speed of the first cooling fan 131 and a second fan speed of the second cooling fan 132.

The housing 110 (shown as the thick-lined box in FIG. 1) may include a plurality of mounts for mounting circuit boards, including the circuit board 121 shown in FIG. 1. For example, the housing 110 may include a plurality of slots for mounting supervisor cards or line cards. The housing 110 may also include a plurality of mounts for mounting fabric cards, cooling fans, power supply units, and baffles. The housing 110 may also be referred to as a "chassis."

The first cooling fan 131 is operable to provide a first airflow through the first cooling zone 150 (shown with vertical and horizontal line cross-hatching) within the housing 110 and across a first portion of the circuit board 121 that is positioned within the first cooling zone 150. In some embodiments the first cooling fan 131 may be electrically coupled with the circuit board 121.

The second cooling fan 132 is operable to provide a second airflow through the second cooling zone 160 (shown with diagonal lines) of the housing 110 and across a second portion of the circuit board 121 that is positioned within the second cooling zone 160. In some embodiments the second cooling fan 132 may be electrically coupled with the circuit board 121.

The first cooling zone 150 is separate from the second cooling zone 160. That is, they are separate physical areas within the housing 110.

In some embodiments the network switch device 100 includes a first temperature sensor positioned in the first cooling zone 150 and a second temperature sensor positioned in the second cooling zone 160. In some embodiments the network switch device 100 may include multiple temperature sensors positioned in the first cooling zone 150. In some embodiments the network switch device 100 may include multiple temperature sensors positioned in the second cooling zone 160. The network switch device 100 may determine a first temperature value from the first temperature sensor positioned in the first zone. The network switch device 100 may determine a second temperature value from the second temperature sensor positioned in the second zone. The network switch device 100 may adjust the first fan speed of the first cooling fan 131 based on the first temperature value. In embodiments where the network switch device 100 includes multiple temperature sensors in the first cooling zone 150, the adjustment of the first fan speed of the first cooling fan 131 may be further based on temperature values determined from the other temperature sensors located in the first cooling zone 150. For example, the first fan speed may be adjusted based on an average, median, or maximum temperature value. In embodiments where the network switch device 100 includes multiple cooling fans positioned in the first cooling zone 150, each of the cooling fans positioned in the first cooling zone 150 may each have their fan speed adjusted based on the temperature values of the one or more temperature sensors positioned in the first cooling zone 150.

The network switch device 100 may adjust the second fan speed of the second cooling fan 132 based on the second temperature value. In embodiments where the network switch device 100 includes multiple temperature sensors in the second cooling zone 160, the adjustment of the second fan speed of the second cooling fan 132 may be further based on temperature values determined from the other temperature sensors located in the second cooling zone 160. For example, the first fan speed may be adjusted based on an average, median, or maximum temperature value. In embodiments where the network switch device 100 includes multiple cooling fans positioned in the second cooling zone 160, each of the cooling fans positioned in the second cooling zone 160 may each have their fan speed adjusted based on the temperature values of the one or more temperature sensors positioned in the second cooling zone 160.

In some embodiments the network switch device 100 may include a supervisor card (not shown in FIG. 1) that is configured to determine the temperature values from the temperature sensors and adjust the fan speeds of the cooling fans accordingly.

The first baffle 140 is positioned between the first cooling zone 150 and the second cooling zone 160. The first baffle 140 is positioned across the circuit board 121. The first baffle 140 is configured to direct the first airflow of the first cooling fan 131 away from the second cooling zone 160 and towards the first cooling zone 150. The first baffle 140 is further configured to direct the second airflow of the second cooling fan 132 away from the first cooling zone 150 and towards the second cooling zone 160. In some embodiments the first baffle 140 may create an airtight seal between the first cooling zone 150 and the second cooling zone 160. In other embodiments the first baffle 140 may not create an airtight seal between the first cooling zone 150 and the second cooling zone 160. In some embodiments, 10-20% of airflow may leak past the baffle. However, overall power consumption for cooling multiple cooling zones may still be reduced, even with 10-20% or more leakage.

The network switch device 100 also includes a power supply unit 170. The power supply unit 170 includes one or more power supply cooling fans (not shown in FIG. 1). In some embodiments the power supply unit 170 includes multiple power supply circuits which each comprise power supply cooling fans. The power supply unit is positioned in a power supply zone within the housing (this zone is not labeled in FIG. 1 but may span the area within the box labeled 170). The power supply cooling fan is operable to provide a power supply airflow through the power supply zone of the housing 110. The power supply zone is separate from the first cooling zone 150 and is also separate from the second cooling zone 160. The network switch device 100 may also include a power supply baffle (not shown in FIG. 1) positioned between the power supply zone and the second zone (e.g., positioned between power supply unit 170 and the second cooling zone 160). The power supply baffle may be configured to direct the power supply airflow away from the second cooling zone 160.

In some embodiments the first baffle 140 includes a first baffle portion 181 mounted to the housing 110 and a second baffle portion 182 mounted to the circuit board 121. For instance, the second baffle portion may be mounted along a length of the circuit board 121 that the first baffle 140 is positioned across. In some embodiments the first baffle 140 also includes a third baffle portion, which may be mounted to the housing 110 or mounted to the circuit board 121.

Figure 2:
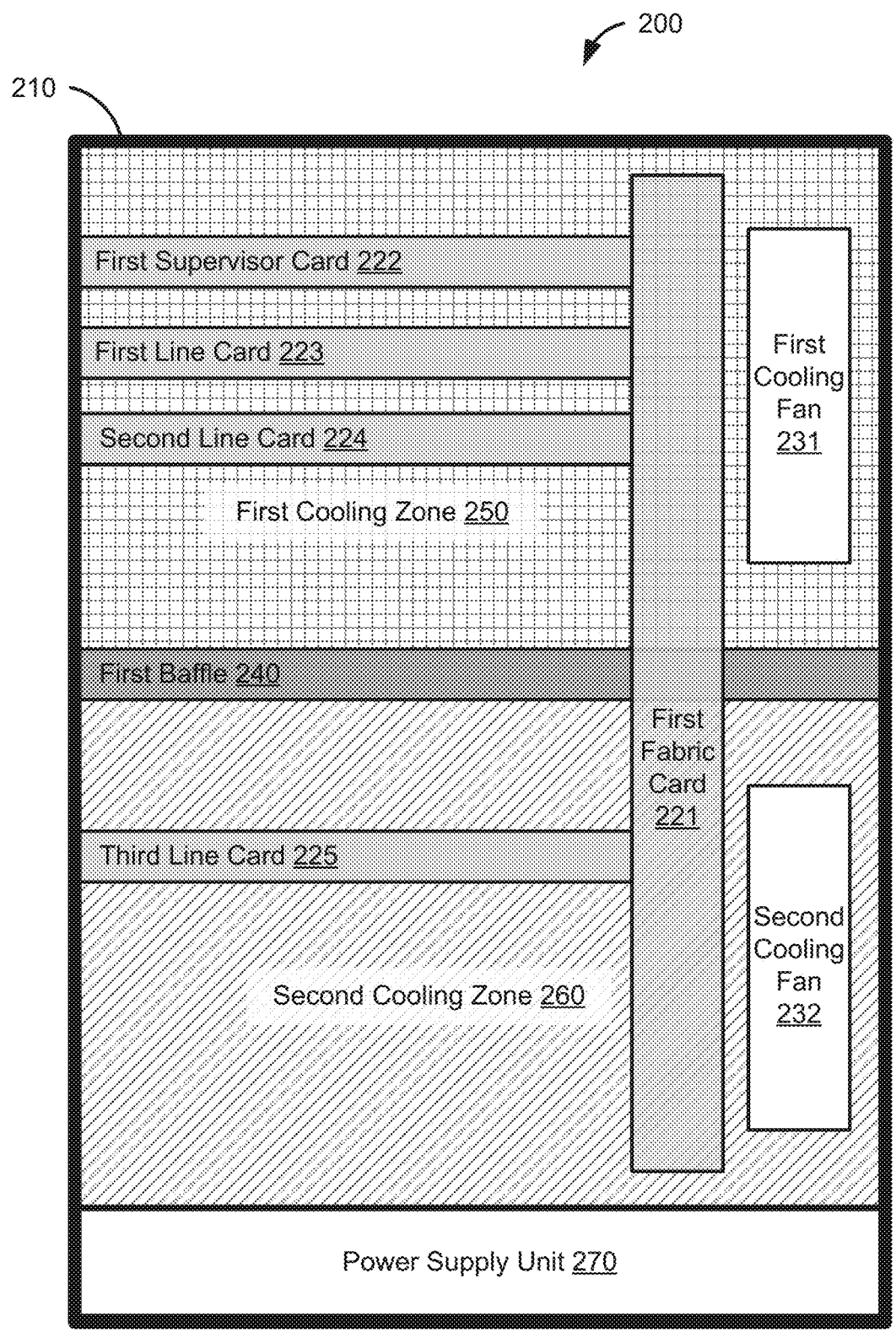
FIG. 2 a diagram of a network switch device including a baffle positioned across a fabric card and between two sets of line cards, according to an embodiment.

FIG. 2 a diagram of network switch device 200 including a baffle 240 positioned across a fabric card 221 and between two sets of line cards, according to an embodiment. The network switch device 200 includes a housing 210, the fabric card 221, a first cooling fan 231, a second cooling fan 232, and a power supply unit 270. The network switch device 200 may also include other cooling fans in some embodiments. The network switch device 200 also includes a first set of line cards positioned in a first cooling zone 250. The first set of line cards include a first line card 223 and a second line card 224. A first supervisor card 222 is also positioned in the first cooling zone 250. The network switch device 200 also includes a second set of line cards positioned in a second cooling zone 260. The second set of line cards includes a third line card 225. The components in FIG. 2 are positioned and dimensions for simplicity of illustrating cooling zones and these components may be positioned and dimensioned differently in other embodiments consistent with the description below.

The network switch device 200 may be a network switch device configured to connect other computer devices over a computer network and the network switch device 200 may include additional components for operating and performing networking functionality that are not shown in FIG. 2 for simplicity of illustration. In some embodiments the network switch device 200 may include other supervisor cards, line cards, and fabric cards, for example. Example network switch devices having additional cards are described below.

The first fabric card 221 is positioned within the housing 210. In some embodiments the first cooling fan 231 and the second cooling fan 232 may be electrically coupled to the first fabric card 221. The first fabric card 221 may be configured to control a first fan speed of the first cooling fan 231 and a second fan speed of the second cooling fan 232.

The housing 210 (shown as the thick-lined box in FIG. 2) may include a plurality of mounts for mounting circuit boards, including the first fabric card 221, the first supervisor card 222, the first line card 223, and the second line card 223. For example, the housing 210 may include a plurality of slots for mounting supervisor cards and line cards. The housing 210 may also include a plurality of mounts for mounting fabric cards, cooling fans, power supply units, and baffles. The housing 210 may also be referred to as a "chassis."

The first cooling fan 231 is operable to provide a first airflow through the first cooling zone 250 (shown with vertical and horizontal line cross-hatching) within the housing 210 and across a first portion of the first fabric card 221 that is positioned within the first cooling zone 250. In some embodiments the first cooling fan 231 may be electrically coupled with the first fabric card 221.

The second cooling fan 232 is operable to provide a second airflow through the second cooling zone 260 (shown with diagonal lines) of the housing 210 and across a second portion of the first fabric card 221 that is positioned within the second cooling zone 260. In some embodiments the second cooling fan 232 may be electrically coupled with the first fabric card 221.

The first cooling zone 250 is separate from the second cooling zone 260. That is, they are separate physical areas within the housing 210.

In some embodiments the network switch device 200 includes a first temperature sensor positioned in the first cooling zone 250 and a second temperature sensor positioned in the second cooling zone 260. The network switch device 200 may determine a first temperature value from the first temperature sensor positioned in the first zone. The network switch device 200 may determine a second temperature value from the second temperature sensor positioned in the second zone. The network switch device 200 may adjust the first fan speed of the first cooling fan 231 based on the first temperature value. The network switch device 200 may adjust the second fan speed of the second cooling fan 232 based on the second temperature value. In some embodiments the first supervisor card 222 is configured to determine the temperature values from the temperature sensors and adjust the fan speeds of the cooling fans accordingly.

The first baffle 240 is positioned between the first cooling zone 250 and the second cooling zone 260. The first baffle 240 is positioned across the fabric card 221. The first baffle 240 is configured to direct the first airflow of the first cooling fan 231 away from the second cooling zone 260 and is further configured to direct the second airflow of the second cooling fan 232 away from the first cooling zone 250. In some embodiments the first baffle 240 may create an airtight seal between the first cooling zone 250 and the second cooling zone 260. In other embodiments the first baffle 240 may not create an airtight seal between the first cooling zone 250 and the second cooling zone 260. In some embodiments, 10-20% of airflow may leak past the baffle. However, overall power consumption for cooling multiple cooling zones may still be reduced, even with 10-20% or more leakage.

The network switch device 200 also includes a power supply unit 270. The power supply unit 270 includes a power supply cooling fan (not shown in FIG. 2). In some embodiments the power supply unit 270 includes multiple power supply circuits which each comprise power supply cooling fans. The power supply unit is positioned in a power supply zone within the housing (this zone is not labeled in FIG. 2 but may span the area within the box labeled 270). The power supply cooling fan is operable to provide a power supply airflow through the power supply zone of the housing 210. The power supply zone is separate from the first cooling zone 250 and is also separate from the second cooling zone 260. The network switch device 200 may also include a power supply baffle (not shown in FIG. 2) positioned between the power supply zone and the second zone (e.g., positioned between power supply unit 270 and the second cooling zone 260). The power supply baffle may be configured to direct the power supply airflow away from the second cooling zone 260.

In some embodiments the first baffle 240 includes a first baffle portion mounted to the housing 210 and a second baffle portion mounted to the fabric card 221. For instance, the second baffle portions may be mounted along a length of the fabric card 221 that the first baffle 240 is positioned across. In some embodiments the first baffle 240 also includes a third baffle portion, which may be mounted to the housing 210 or mounted to the fabric card 221.

Figure 3:
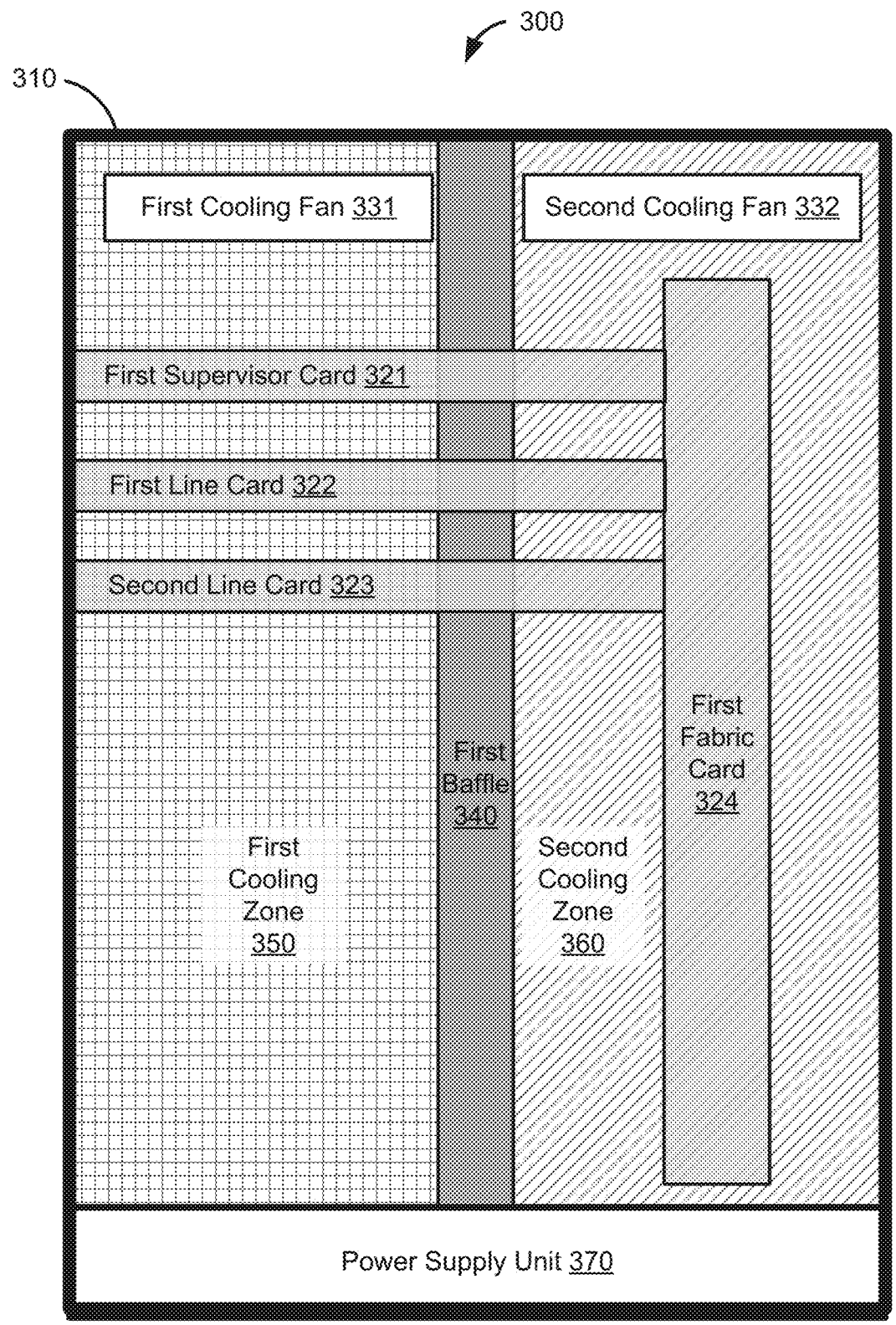
FIG. 3 shows a diagram of a network switch device including a baffle positioned across a set of line cards, according to an embodiment.

FIG. 3 shows a diagram of network switch device 300 including a first baffle 340 positioned across a set of line cards, according to an embodiment. The network switch device 300 includes a housing 310, a first fabric card 324, a first cooling fan 331, a second cooling fan 332, and a power supply unit 370. The network switch device 300 may further include other cooling fans in some embodiments. The network switch device 300 also includes a set of line cards positioned across a first cooling zone 350 and a second cooling zone 360. The set of line cards include a first line card 322 and a second line card 323. A first supervisor card 321 is also positioned across the first cooling zone 350 and the second cooling zone 360. The first fabric card 324 is positioned in the second cooling zone. The components in FIG. 3 are positioned and dimensions for simplicity of illustrating cooling zones and these components may be positioned and dimensioned differently in other embodiments consistent with the description below.

The network switch device 300 may be a network switch device configured to connect other computer devices over a computer network and the network switch device 300 may include additional components for operating and performing networking functionality that are not shown in FIG. 3 for simplicity of illustration. In some embodiments the network switch device 200 may include other supervisor cards, line cards, and fabric cards, for example.

The first fabric card 324 is positioned within the housing 310. In some embodiments the first cooling fan 331 and the second cooling fan 332 may be electrically coupled to the first fabric card 324. The first fabric card 324 may be configured to control a first fan speed of the first cooling fan 331 and a second fan speed of the second cooling fan 332.

The housing 310 (shown as the thick-lined box in FIG. 3) may include a plurality of mounts for mounting circuit boards, including the first fabric card 324, the first supervisor card 321, the first line card 322, and the second line card 323. For example, the housing 310 may include a plurality of slots for mounting supervisor cards and line cards. The housing 310 may also include a plurality of mounts for mounting fabric cards, cooling fans, power supply units, and baffles. The housing 310 may also be referred to as a "chassis."

The first cooling fan 331 is operable to provide a first airflow through the first cooling zone 350 (shown with vertical and horizontal line cross-hatching) within the housing 310 and across a first portion of the first supervisor card 321, a first portion of the first line card 322, and a first portion of the second line card 232 that are positioned within the first cooling zone 350.

The second cooling fan 332 is operable to provide a second airflow through the second cooling zone 360 (shown with diagonal lines) of the housing 310 and across the first fabric card 324 and a second portion of the first supervisor card 321, a second portion of the first line card 322, and as second portion of the second line card 232 that are positioned within the second cooling zone 360.

The first cooling zone 350 is separate from the second cooling zone 360. That is, they are separate physical areas within the housing 310.

In some embodiments the network switch device 300 includes a first temperature sensor positioned in the first cooling zone 350 and a second temperature sensor positioned in the second cooling zone 360. The network switch device 300 may determine a first temperature value from the first temperature sensor positioned in the first zone. The network switch device 300 may determine a second temperature value from the second temperature sensor positioned in the second zone. The network switch device 300 may adjust the first fan speed of the first cooling fan 331 based on the first temperature value. The network switch device 300 may adjust the second fan speed of the second cooling fan 332 based on the second temperature value. In some embodiments the first supervisor card 321 is configured to determine the temperature values from the temperature sensors and adjust the fan speeds of the cooling fans accordingly.

The first baffle 340 is positioned between the first cooling zone 350 and the second cooling zone 360. The first baffle 340 is positioned across the fabric card 321. The first baffle 340 is configured to direct the first airflow of the first cooling fan 331 away from the second cooling zone 360 and is further configured to direct the second airflow of the second cooling fan 332 away from the first cooling zone 350. In some embodiments the first baffle 340 may create an airtight seal between the first cooling zone 350 and the second cooling zone 360. In other embodiments the first baffle 340 may not create an airtight seal between the first cooling zone 350 and the second cooling zone 360. In some embodiments, 10-20% of airflow may leak past the baffle. However, overall power consumption for cooling multiple cooling zones may still be reduced, even with 10-20% or more leakage.

The network switch device 300 also includes a power supply unit 370. The power supply unit 370 includes a power supply cooling fan (not shown in FIG. 3). In some embodiments the power supply unit 370 includes multiple power supply circuits which each comprise power supply cooling fans. The power supply unit is positioned in a power supply zone within the housing (this zone is not labeled in FIG. 3 but may span the area within the box labeled 370). The power supply cooling fan is operable to provide a power supply airflow through the power supply zone of the housing 310. The power supply zone is separate from the first cooling zone 350 and is also separate from the second cooling zone 360. The network switch device 300 may also include a power supply baffle (not shown in FIG. 3) positioned between the power supply zone and the second zone (e.g., positioned between power supply unit 370 and the second cooling zone 360). The power supply baffle may be configured to direct the power supply airflow away from the second cooling zone 360.

In some embodiments the first baffle 340 includes a first baffle portion mounted to the housing 310 and a second baffle portion mounted to one of the first supervisor card 321, the first line card 322, or the second line card 323. In some embodiments, each of the first supervisor card 321, the first line card 322, and the second line card 323 may have baffle portions mounted thereon. In some embodiments the first baffle 340 also includes a third baffle portion, which may be mounted to the housing 310 or mounted to one of the first supervisor card 321, the first line card 322, or the second line card 323.

Figure 4:
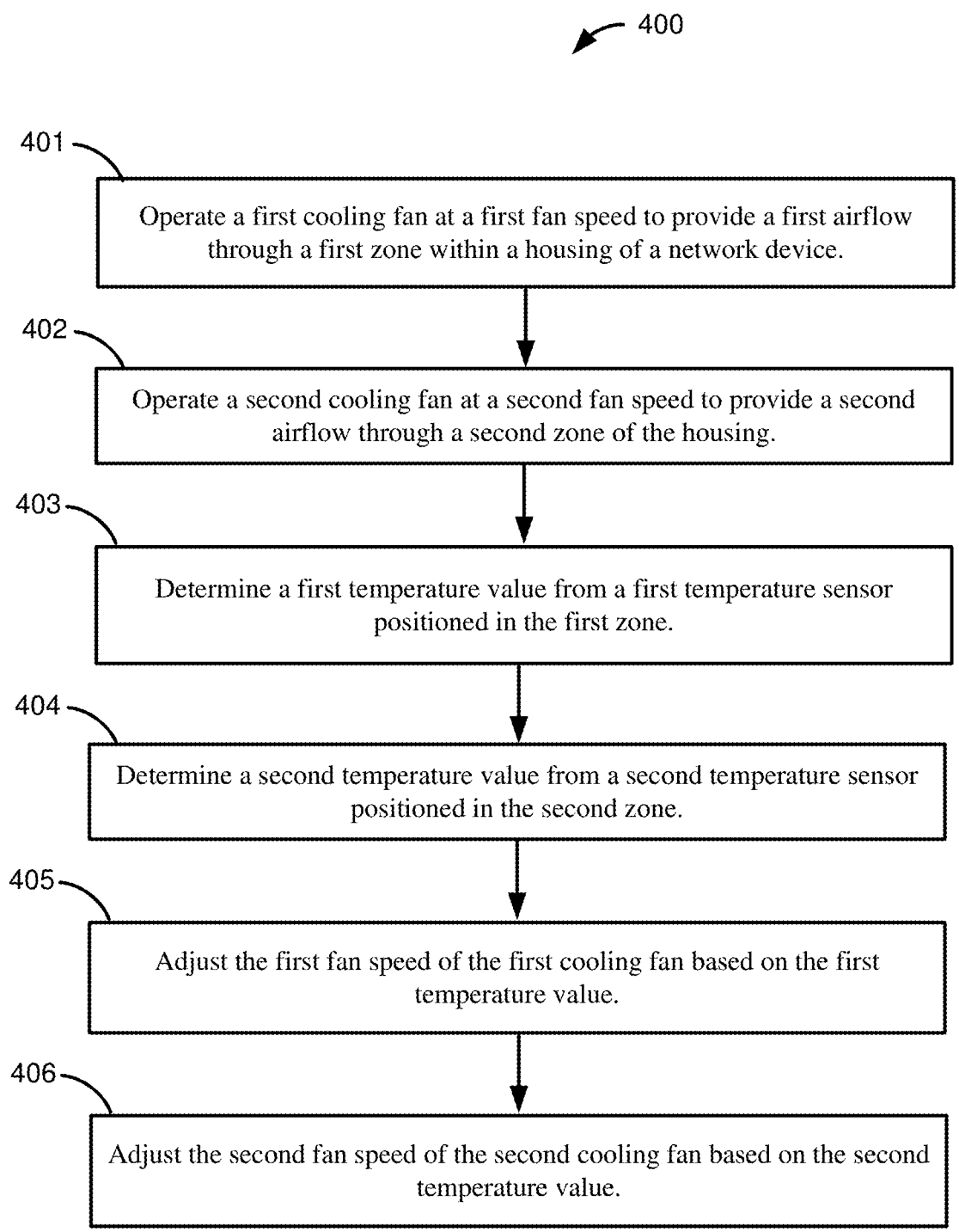
FIG. 4 shows a flowchart of a method for cooling a network switch device using multiple cooling zones, according to an embodiment.

FIG. 4 shows a flowchart 400 of a method for cooling a network switch device using multiple cooling zones, according to an embodiment. The method may be implemented by the network switch devices described above with respect to FIGS. 1-3 or by the network switch devices described below with respect to FIGS. 5-8.

At 401, operate a first cooling fan at a first fan speed to provide a first airflow through a first zone within a housing of a network switch device. The first airflow may be provided across a first portion of a circuit board positioned within the first zone.

At 402, operate a second cooling fan at a second fan speed to provide a second airflow through a second zone of the housing. The network switch device may further include other cooling fans in some embodiments. The second airflow may be provided across a second portion of the circuit board positioned within the second zone, The first fan speed may be different from the second fan speed. The first zone may be separate from the second zone. The network switch device may comprise a first baffle positioned between the first zone and the second zone and positioned across the circuit board. The first baffle may be configured to direct the first airflow away from the second zone and configured to direct the second airflow away from the first zone.

In some embodiments, the first cooling fan and the second cooling fan are electrically coupled to the circuit board. In other embodiments, the first cooling fan or the second cooling fan, or both, are electrically coupled to a different circuit board. In some embodiments the first cooling fan, the second cooling fan, or both may be mechanically coupled with the circuit board. In other embodiments the first cooling fan, the second cooling fan, or both may not be mechanically coupled with the first board.

In some embodiments the baffle includes a first baffle portion mounted to the housing and a second baffle portion mounted to the circuit board.

In some embodiments, the circuit board is a fabric card and the network switch device further comprises a first line card electrically coupled to the fabric card and positioned within the first zone. In such embodiments the network switch device may further comprise a second line card electrically coupled to the fabric card and positioned within the second zone. In some such embodiments the network switch device further comprises a third line card electrically coupled to the fabric card and positioned in a third zone within the housing. In such embodiments the third zone is separate from the first zone and separate from the second zone. In such embodiments the network switch device may comprise a third baffle positioned between the second zone and the third zone and positioned across the circuit board. In such embodiments the method may further include operating a third cooling fan to provide a third airflow through the third zone and across a third portion of the circuit board positioned within the third zone. In such embodiments the third baffle may be configured to direct the third airflow away from the second zone and configured to direct the second airflow away from the third zone.

In other embodiments the circuit board may be a first line card. In such embodiments the network switch device may further comprise a fabric card electrically coupled to the first line card.

In some embodiments, the network switch device may further comprise a power supply unit including a power supply cooling fan. In such embodiments the method may include operating, by the network switch device, the power supply cooling fan of the power supply unit. The power supply unit may be positioned in a power supply zone within the housing. The power supply zone may be separate from the first zone and separate from the second zone. The network switch device may comprise a power supply baffle positioned between the power supply zone and the second zone. The operating of the power supply cooling fan may provide a power supply airflow through the power supply zone of the housing. The power supply baffle may be configured to direct the third power supply airflow away from the second zone.

In some embodiments the network switch device further comprises a second fabric card positioned partially in a third zone within the housing and positioned partially in a fourth zone within the housing. In such embodiments the network switch device may further comprise a fourth baffle positioned between the third zone and the fourth zone and positioned across the second fabric card. In such embodiments the method may further include operating a third cooling fan operable to provide a third airflow through the third zone and across a first portion of the second fabric card positioned within the third zone, where the third zone is separate from the first zone and separate from the second zone. In such embodiments the method may further include operating, by the network switch device, a fourth cooling fan operable to provide a fourth airflow through a fourth zone within the housing and across a second portion of the second fabric card positioned within the fourth zone, where the fourth zone is separate from the first zone, separate from the second zone, and separate from the third zone. The fourth baffle may be configured to direct the third airflow away from the fourth zone and configured to direct the fourth airflow away from the third zone.

The network switch device comprises a first temperature sensor positioned in the first zone and a second temperature sensor positioned in the second zone.

At 403, determine a first temperature value from a first temperature sensor positioned in the first zone. In some embodiments the network switch device may include a supervisor card and the supervisor card may determine the first temperature value.

At 404, determine a second temperature value from a second temperature sensor positioned in the second zone. In some embodiments the supervisor card may determine the second temperature value.

At 405, adjust the first fan speed of the first cooling fan based on the first temperature value. In some embodiments the supervisor card may adjust the first fan speed.

At 406, adjust the second fan speed of the second cooling fan based on the second temperature value. In some embodiments the supervisor card may adjust the second fan speed.

The method for cooling the network switch device using multiple cooling zones provides advantages of prior network switch device cooling techniques. For instance, the method provides decreased cooling fan power consumption and reduced fan wear and tear compared to prior network devices, especially in situations where certain components of the network switch device run hotter than others or where certain card slots are in operation while other card slots are empty. The use of cooling zones with baffles provided thereby also provides for efficient power reduction of fans cooling cards that are handling less network traffic compared to cards in another zone where the fans must run at a higher fan speed, using more power, to cool cards handling a greater amount of network traffic.

Example Cooling Zone Configuration

Additional examples of cooling zone figurations are described below with respect to FIGS. 5-7. The network switch device described with respect to FIG. 5 may be configured to implement the method described above with respect to FIG. 4. In these examples of FIGS. 5-7, the housings ("chassis") may have one or more baffles configured to separate the housing into airflow zones of four line card slots each. Additionally, one airflow or cooling zone supplies airflow to two supervisor card slots. The fan speeds in each zone may be independently software adjusted to optimize overall system power consumption. There may or may not be an airtight seal between the cooling zones (e.g., air leakage may or may not occur between zones). In these examples, the power supplies reside in their own separate cooling zone in all chassis. Each power supply unit may have its own internal controlled fan for self cooling. In some cases, there may not be leakage from the power supply airflow zone to the adjacent cooling zones. In these examples, the power supply units are sealed off. In other embodiments the power supply units may not be sealed off from the other cooling zones.

Figure 5:
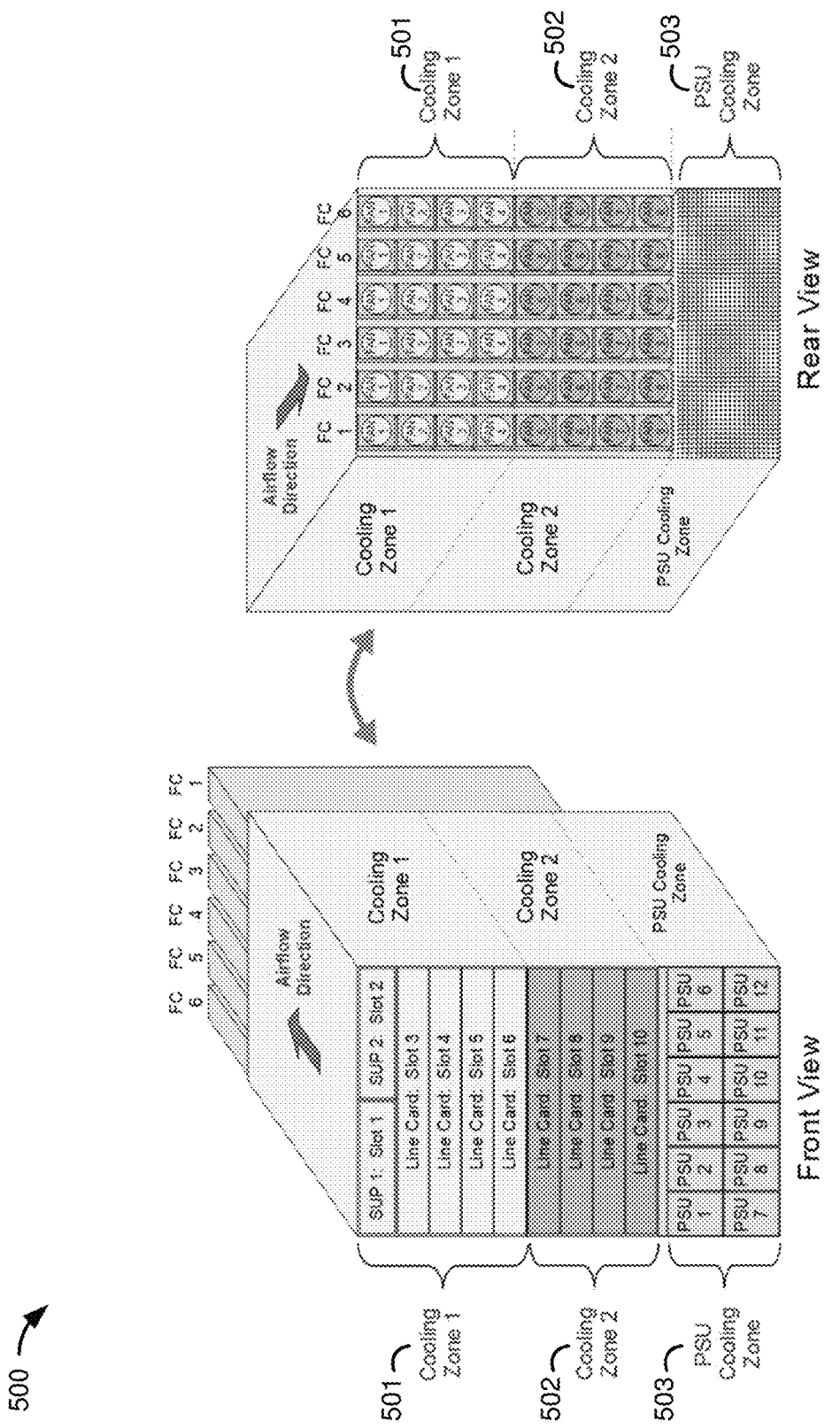
FIG. 5 shows an illustration of a network switch device having fabric cards that have fans cooling two cooling zones, according to an embodiment.

FIG. 5 shows an illustration 500 of a network switch device having fabric cards that have fans cooling two cooling zones 501, 502, according to an embodiment. The network switch device also includes power supply units having their own fans that cool a separate power supply unit cooling zone 503. The illustration 500 shows both a front view and a rear view of the network switch device.

In this embodiment, the network switch device includes six fabric cards (labeled "FC1," "FC2," "FC3," "FC4," "FC5," and "FC6" in FIG. 5) having fans for cooling two supervisor card slots (labeled "SUP 1: Slot 1" and "SUP 2: Slot 2"), and eight line card slots (labeled "Line Card: Slot 3," "Line Card: Slot 4," "Line Card: Slot 5," "Line Card: Slot 6," "Line Card: Slot 7," "Line Card: Slot 8," "Line Card: Slot 9," and "Line Card: Slot 10"). As shown in the rear view, each fabric card includes eight cooling fans (labeled "FAN 1," "FAN 2," "FAN 3," "FAN 4," "FAN 5," "FAN 6," "FAN 7," and "FAN 8"). The network switch device may further include other cooling fans in some embodiments. The network switch device also includes twelve power supply units (labeled "PSU 1," "PSU 2," "PSU 3," "PSU 4," "PSU 5," "PSU 6," "PSU 7," "PSU 8," "PSU 9," "PSU 10," "PSU 11," and "PSU 12").

As shown in FIG. 5, the two supervisor card slots (slot 1 and 2) and the upper four line card slots (slots 3-6) are in a first cooling zone "cooling zone 1" 501 while the lower four line card slots (slot 6-10) are cooled in a second cooling zone "cooling zone 2" 502. The first cooling zone 501 is cooled by airflow from FAN 1-4 of FC1-6 while the second cooling zone 502 is cooled by airflow from FAN 5-8 of FC 1-6. The twelve power supply units are cooled in a third cooling zone 503 by their own built-in power supply unit fans. The network switch device may include a first baffle positioned between the first cooling zone 501 and the second cooling zone 502 such that airflow from FANs 1-4 is directed toward slots 1-6 and away from slots 7-10. The first baffle may also be configured to direct airflow from FANs 5-8 towards slots 7-10 and away from slots 1-6. A second power supply baffle may be positioned between the second cooling zone 502 and the power supply cooling zone 503. The second baffle may direct air from FANs 5-8 towards slot 7-10 and away from the power supply units.

A supervisor card in slot 1 or 2 may be configured to read temperature sensors of each supervisor card, line card, and fabric card and any other temperature sensors within the network switch device. The supervisor card may then determine one or more temperature values for each cooling zone and adjust the fan speed of the fans cooling that cooling zone based on the corresponding one or more temperature values.

Figure 6:
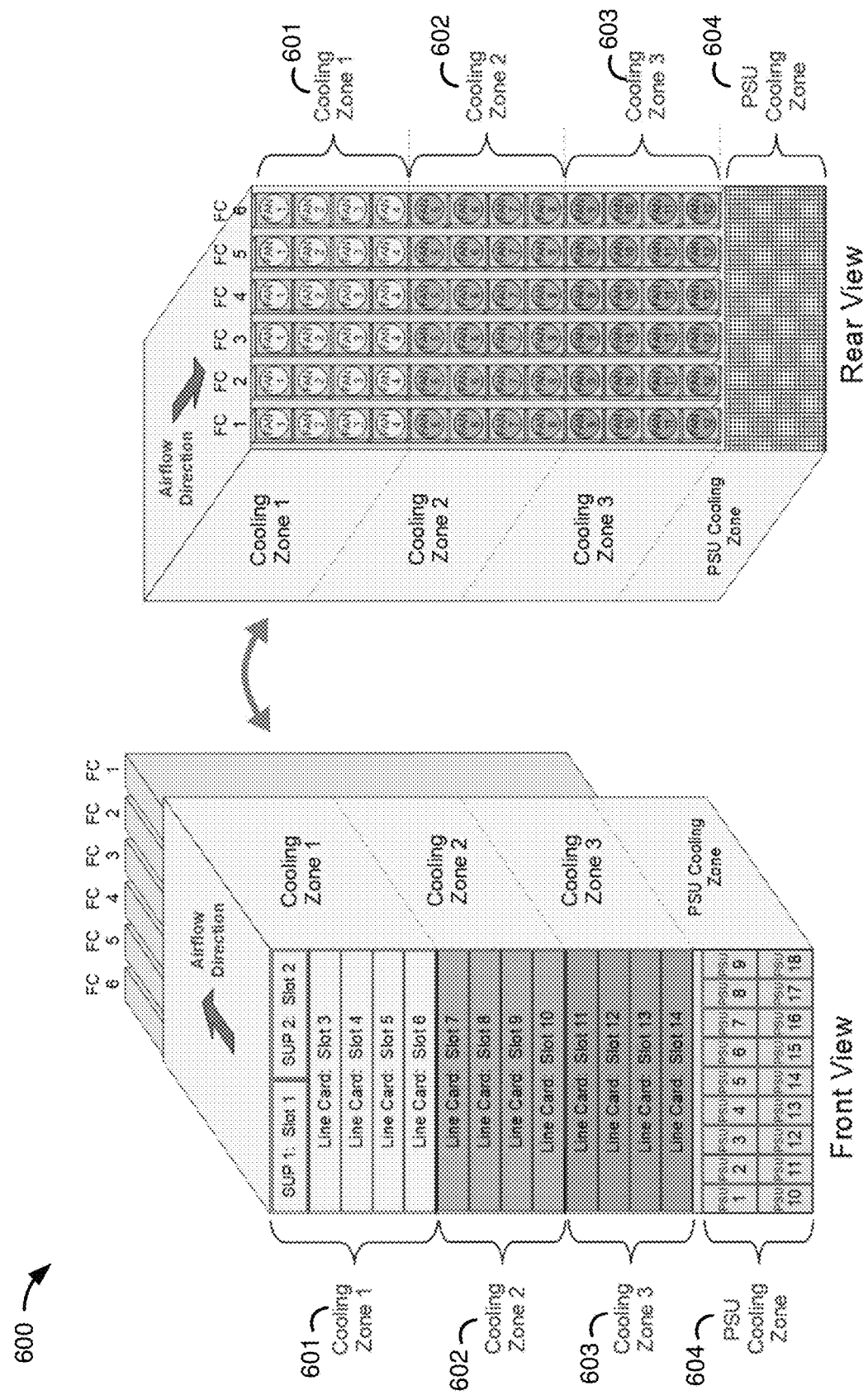
FIG. 6 shows an illustration of a network switch device having fabric cards that have fans cooling three cooling zones, according to an embodiment.

FIG. 6 shows an illustration 600 of a network switch device having fabric cards that have fans cooling three cooling zones 601, 602, 603, according to an embodiment. The network switch device also includes power supply units having their own fans that cool a separate power supply unit cooling zone 604. The illustration 600 shows both a front view and a rear view of the network switch device.

In this embodiment, the network switch device includes six fabric cards (labeled "FC1," "FC2," "FC3," "FC4," "FC5," and "FC6") having fans for cooling two supervisor card slots (labeled "SUP 1: Slot 1" and "SUP 2: Slot 2"), and twelve line card slots (labeled "Line Card: Slot 3," "Line Card: Slot 4," "Line Card: Slot 5," "Line Card: Slot 6," "Line Card: Slot 7," "Line Card: Slot 8," "Line Card: Slot 9," "Line Card: Slot 10," "Line Card: Slot 11," "Line Card: Slot 12," "Line Card: Slot 13," and "Line Card: Slot 14"). As shown in the rear view, each fabric card includes twelve cooling fans (labeled "FAN 1," "FAN 2," "FAN 3," "FAN 4," "FAN 5," "FAN 6," "FAN 7," "FAN 8," "FAN 9," "FAN 10," "FAN 11," and "FAN 12"). The network switch device also includes eighteen power supply units (labeled "PSU 1," "PSU 2," "PSU 3," "PSU 4," "PSU 5," "PSU 6," "PSU 7,"

"PSU 8," "PSU 9," "PSU 10," "PSU 11," "PSU 12," "PSU 13," "PSU 14," "PSU 15," "PSU 16," "PSU 17," and "PSU 18").

As shown in FIG. 6, the two supervisor card slots (slot 1 and 2) and the upper four line card slots (slots 3-6) are in a first cooling zone "cooling zone 1" 601 while the middle four line card slots (slot 6-10) are cooled in a second cooling zone "cooling zone 2" 602. The first cooling zone 601 is cooled by airflow from FAN 1-4 of FC 1-6 while the second cooling zone 602 is cooled by airflow from FAN 5-8 of FC 1-6. The lower four line card slots (slot 11-14) are cooled in a third cooling zone "cooling zone 3" 603 by airflow from FAN 9-12 of FC 1-6. The eighteen power supply units are cooled in a fourth power supply cooling zone 604 by their own built-in power supply unit fans. The network switch device may include a first baffle positioned between the first cooling zone 501 and the second cooling zone 502 such that airflow from FANs 1-4 is directed toward slots 1-6 and away from slots 7-10. The first baffle may also be configured to direct airflow from FANs 5-8 towards slots 7-10 and away from slots 1-6. The network switch device may include a second baffle positioned between the second cooling zone 602 and the third cooling zone 603 such that airflow from FANs 5-8 is directed toward slots 7-10 and away from slots 11-14. The second baffle may also be configured to direct airflow from FANs 9-12 towards slots 11-14 and away from slots 7-10.

A third power supply baffle may be positioned between the third cooling zone 603 and the power supply cooling zone 603. The third baffle may direct air from FANs 9-12 towards slots 11-14 and away from the power supply units.

A supervisor card in slot 1 or 2 may be configured to read temperature sensors of each supervisor card, line card, and fabric card and any other temperature sensors within the network switch device. The supervisor card may then determine one or more temperature values for each cooling zone and adjust the fan speed of the fans cooling that cooling zone based on the corresponding one or more temperature values.

Figure 7:
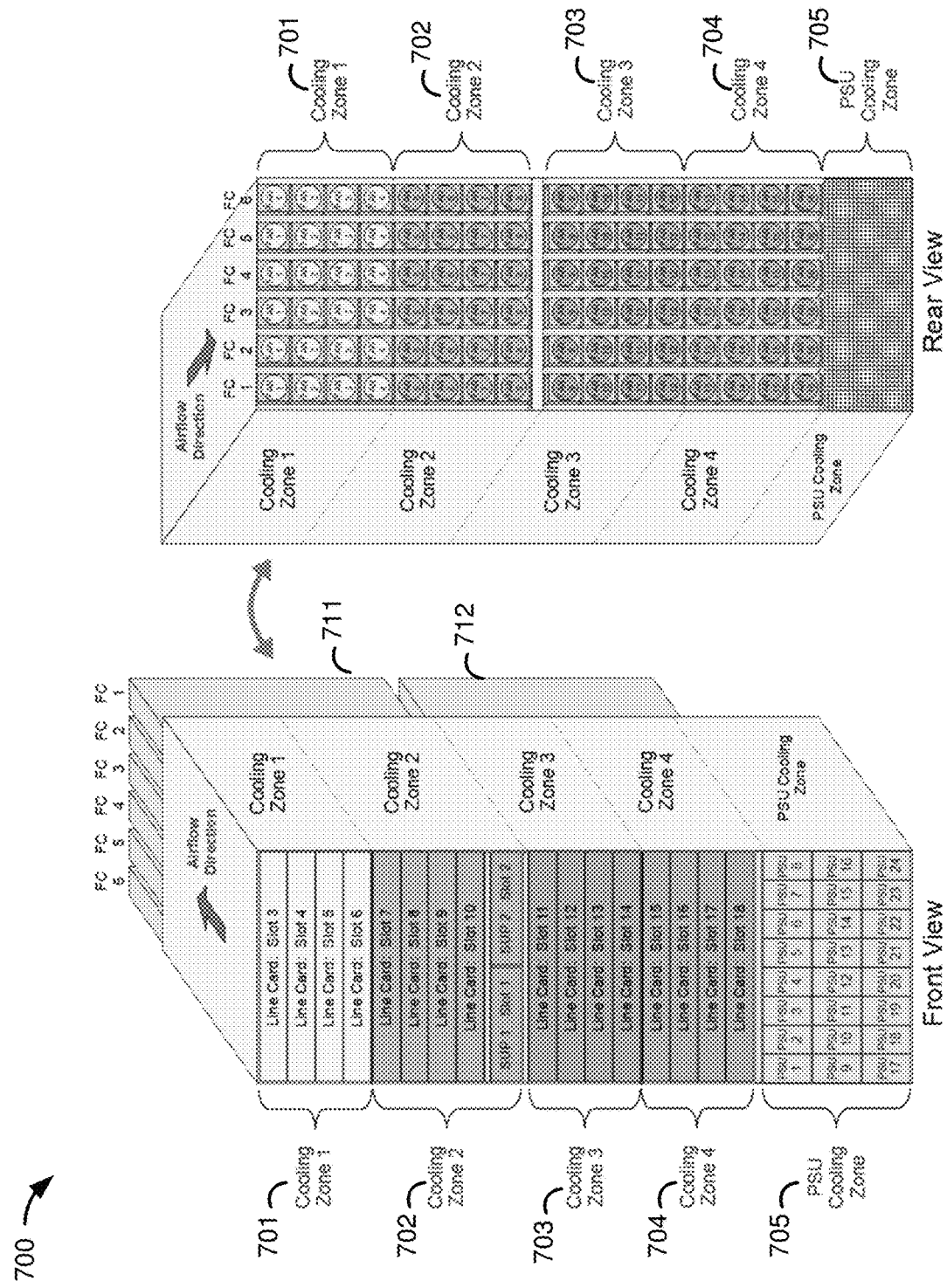
FIG. 7 shows an illustration of a network switch device having two sets of hardware fabric cards where each set of hardware fabric cards have fans cooling two cooling zones, according to an embodiment.

FIG. 7 shows an illustration of a network switch device having two sets of hardware fabric cards where each set of hardware fabric cards have fans cooling two cooling zones, according to an embodiment. The illustration 700 shows both a front view and a rear view of the network switch device.

In this embodiment, each of the six functional fabric cards (e.g., circuitry configured to perform fabric card operations) comprises two separate physical hardware fabric cards, for twelve hardware fabric cards in total. The network switch device may include wiring (not shown) to electrically connect each pair of upper and lower physical fabric cards (e.g., an upper fabric card 711 of fabric card "FC1" and a lower fabric card 712 of "FC1") such that they may perform as a single functional fabric card. In particular, the network switch device includes six functional fabric cards (labeled "FC1," "FC2," "FC3," "FC4," "FC5," and "FC6") which each comprise two physical hardware fabric cards. The upper set of physical fabric cards of FC1-6 have cooling fans configured to cool a first cooling zone 701 "Cooling Zone 1" and a second cooling zone 702 "Cooling Zone 2." The lower set of physical fabric cards of FC1-6 have cooling fans configured to cool a third cooling zone 703 "Cooling Zone 3" and a fourth cooling zone 704 "Cooling Zone 4." The network switch device also includes power supply units having their own fans that cool a separate power supply unit cooling zone 705.

The fans of fabric cards FC1-6 provide cooling for two supervisor card slots (labeled "SUP 1: Slot 1" and "SUP 2: Slot 2"), and sixteen line card slots (labeled "Line Card: Slot 3," "Line Card: Slot 4," "Line Card: Slot 5," "Line Card: Slot 6," "Line Card: Slot 7," "Line Card: Slot 8," "Line Card: Slot 9," "Line Card: Slot 10," "Line Card: Slot 11," "Line Card: Slot 12," "Line Card: Slot 13," "Line Card: Slot 14," "Line Card: Slot 15," "Line Card: Slot 16," "Line Card: Slot 17," and "Line Card: Slot 18"). As shown in the rear view, each physical upper fabric card includes eight cooling fans (labeled "FAN 1," "FAN 2," "FAN 3," "FAN 4," "FAN 5," "FAN 6," "FAN 7," and "FAN 8") and each physical lower fabric card includes eight cooling fans (labeled "FAN 9," "FAN 10," "FAN 11," "FAN 12," "FAN 13," "FAN 14," "FAN 15," and "FAN 16"). The network switch device also includes twenty four power supply units (labeled "PSU 1," "PSU 2," "PSU 3," "PSU 4," "PSU 5," "PSU 6," "PSU 7," "PSU 8," "PSU 9," "PSU 10," "PSU 11," "PSU 12," "PSU 13," "PSU 14," "PSU 15," "PSU 16," "PSU 17," "PSU 18," "PSU 19," "PSU 20," "PSU 21," "PSU 22," "PSU 23," and "PSU 24").

As shown in FIG. 7, the four line cards in line card slot 3-6 are positioned in the first cooling zone 701 and are configured to be cooled by fans 1-4 of each of the six fabric cards FC 1-6. The four line cards in line card slots 7-10 and the two supervisor cards in SUP Slot 1 and Slot 2 are positioned in the second cooling zone 702 and are configured to be cooled by fans 5-8 of each of the six fabric cards FC 1-6. The four line cards in line card slots 11-14 are positioned in the third cooling zone 703 and are configured to be cooled by fans 9-12 of each of the six fabric cards FC 1-6. The four line cards in line card slot 15-18 are positioned in the fourth cooling zone 704 and are configured to be cooled by fans 13-16 of each of the six fabric cards FC 1-6.

The network switch device may include a first baffle positioned between the first cooling zone 701 and the second cooling zone 702. The first baffle may be configured to direct a first airflow from fans 1-4 towards the first cooling zone 701 and away from the second cooling zone 702. The first baffle may be configured to direct a second airflow from fans 5-8 towards the second cooling zone 702 and away from the first cooling zone 701.

The network switch device may include a second baffle positioned between the second cooling zone 702 and the third cooling zone 703. The second baffle may be configured to direct a second airflow from fans 5-8 towards the second cooling zone 702 and away from the third cooling zone 703. The second baffle may be configured to direct a third airflow from fans 9-12 towards the third cooling zone 703 and away from the second cooling zone 702. In some embodiments the second baffle may include one or more structural components (e.g., a shelf) of a housing of the network switch device. In some embodiments the second baffle may include one or more mounting trays for mounting physical fabric cards in the network switch device.

The network switch device may include a third baffle positioned between the third cooling zone 703 and the fourth cooling zone 704. The third baffle may be configured to direct a third airflow from fans 9-12 towards the third cooling zone 703 and away from the fourth cooling zone 704. The third baffle may be configured to direct a fourth airflow from fans 13-16 towards the fourth cooling zone 704 and away from the third cooling zone 703.

The network switch device may include a fourth baffle positioned between the fourth cooling zone 704 and the power supply unit cooling zone 705. The fourth baffle may be configured to direct the fourth airflow from fans 13-16 towards the fourth cooling zone 704 and away from the power supply unit cooling zone 705. The fourth baffle may be configured to direct a power supply airflow provided by fans of the power supply units towards the power supply unit cooling zone 705 and away from the fourth cooling zone 704.

A supervisor card in slot 1 or 2 may be configured to read temperature sensors of each supervisor card, line card, and fabric card and any other temperature sensors within the network switch device. The supervisor card may then determine one or more temperature values for each cooling zone and adjust the fan speed of the fans cooling that cooling zone based on the corresponding one or more temperature values. The fans configured to cool the different cooling zones may be set to different fan speeds. The fans configured to cool the same cooling zone may be set to the same fan speed.

In some embodiments each of the twelve physical fabric cards are mounted in a corresponding mounting tray and the trays are mounted to the housing (e.g., chassis) of the network switch device. In some embodiments the network switch device may not include separate baffles mounted to its housing and instead trays of the fabric cards may be configured to act as baffles, directing airflow to corresponding cooling zones. Referring to FIG. 7, one variation of this example, the trays of the upper set of fabric cards provide a baffle between the second cooling zone 702 and the third cooling zone 703. The trays of the lower set of fabric cards also provide a baffle between the second cooling zone 702 and the third cooling zone 703. In such an embodiment, the network switch device may not include a baffle between the first cooling zone 701 and the second cooling zone 702 of FIG. 7 and instead may have a upper cooling zone (not shown in FIG. 7) for cooling line card slots 3-10 and supervisor card slots SUP 1-2. In such an embodiment the network switch device may not include a baffle between the third cooling zone 703 and the fourth cooling zone 704 and instead may have a lower cooling zone (not shown in FIG. 7) for cooling line card slots 11-18. Thus, in embodiments where a network switch device includes a set of functional fabric cards comprising an upper set of physical fabric cards and a lower set of physical fabric cards, the network switch device may be configured to provide an upper cooling zone and a lower cooling zone without a separate baffle being mounted to a housing of the network switch device. In such embodiments the housing of the network switch device and other components of the network switch device may direct airflow by their dimension and positioning but they may not have been positioned for the purpose of directing airflow.

Example Cooling Zone Software

Fans configured to cool a given cooling zone given the baffle positioned may be set to the same speed. Each cooling zone may have fan speeds set different from another. In some embodiments there may be air leakage between cooling zones (e.g., in cases where the baffle is not airtight). In such cases, the greater a fan speed differential between the cooling zones, the greater the leakage as an overall percentage. Therefore, the effectiveness of a given fan speed in a given zone may be influenced by the airflow situation in adjacent zones and may be adjusted accordingly to account for the extent of the leakage. That is, the fan speed for a particular cooling zone may not only be based on temperature readings of temperature sensors within that cooling zone, but further based on a fan speed of adjacent cooling zones. Cooling software (e.g., part of an operating system running on the network switch device) may periodically monitor the temperature sensors (e.g., of line cards, optics, supervisors, and fabric cards) in each cooling zone and adjust the fan speed accordingly.

A number of cooling zones supported on a network switch device may be defined in a chassis Field Replaceable Unit (FRU) manifest file (referred to as a "manifest file"). One or more manifest files may define some or all hardware components of the network switch device. For example, fabric cards, line cards, fans, temp sensors, and a number of supported cooling domains may be defined in manifest files. For instance, a manifest file may define fabric cards for a particular model or type of chassis. That manifest may indicate that a fabric card of a particular model supports three cooling domains, has ten temperature sensors, and three fans, for example. In this example, the manifest file indicates which temperature sensors are positioned in which cooling zone and which fans are used to provide airflow for which cooling zone. Manifest files defining hardware components of a device may be stored in a memory of that device. For example, fabric cards and/or line cards may include an IDPROM or SEEPROM storing a manifest file. The manifest file may be stored in binary format and may include indications of: a model of hardware, a serial number, a MAC address, etc. Manifest files may also be stored on a memory of the network switch device itself. In some embodiments, the network switch device operating system software may detect when a new card is inserted/detected and may read the manifest file from the detected card. The model indicator and other hardware descriptors of the detected card may be determined based on the manifest file. In some embodiments, the manifest file may be executable code. For example, the manifest file may be a plugin such as a Python plugin. Software of the network switch device may use the card model indicator to load a corresponding plugin (e.g., a Python plugin), modify the plugin (e.g., insert manifest file information as variables), and execute the plugin code. The plugin may register the hardware components of the card in the system (e.g., add hardware component entities to a table or database).

Some fabric cards may not support multiple cooling zones. However, some users of network switch devices may want to use unsupported fabric cards in a network switch device having baffles to define multiple cooling zones. Software of the network switch device may provide a setting to disable multiple cooling zone support such that unsupported fabric cards (without multiple cooling zone support) may be used in such network switch devices. A command line interface (CLI) command may be used to enable or disable the multiple cooling zone software techniques (e.g., adjusting fans for different cooling zones differently) on the network switch devices.

Regardless of the multiple cooling zones being enabled or disabled (for fabric card cooling fans), the network switch device may support a separate cooling zone for power supply units. To prevent confusion of a user using commands to review temperature information of temperature sensors in the network switch device, the command printing the temperature information may indicate that the network switch device is configuring line card and fabric card cooling zones, but not the power supply cooling zone.

A CLI command can enable or disable multiple cooling zones as described above.

Another CLI command can enable a user to select the number of cooling zones for a particular fabric card. This command may be useful if the fabric card is moved to a different network switch device having a different configuration of cooling zones.

Example CLI commands and example corresponding outputs are provided below.

Example CLI command and output:
nfc423 (s1) (config) #environment cooling zones?
1 Use 1 zone
2 Use 2 zones Example CLI command and output:
nfc423 (s1) (config) #environment cooling zones 2!
! WARNING: Change will take effect only after the switch reboot.
! Save config and reboot the switch.

Example CLI command and output:
show system environment cooling
System cooling status is: Ok
Ambient temperature: 30 C
Airflow: port-side intake
Number of cooling zones is: 1
Configured number of cooling zones is: 1 (default).

Example CLI Command and output to show a number of supported cooling domains:
nfc423 (s1) (config) #show system environment cooling | json{
"defaultzones": false,
"numCoolingZones": [
1,
2
],
. . .

Example CLI command and output:
nfc423 (s1) (config) #show system environment cooling
System cooling status is: Ok
Ambient temperature: 29 C
Airflow: port-side intake
Number of cooling zones is: 1
Configured number of cooling zones is: 2

Example CLI command and output:
> (config) #[no | default] environment cooling-domains single | multiple [2| 4]
! WARNING: Change will take effect only after switch reboot.
! Save config and reboot switch.

Example CLI output showing different fan speeds (shows as percentage of maximum instead of as a rate per minute) configured for different cooling zones (e.g., slots 1-6 in cooling zone 1 and slots 7-10 in cooling zone 2):

| Slot | Status | Fan Speed |
| --- | --- | --- |
| 1 | Ok | 61% |
| 2 | Ok | 61% |
| 3 | Ok | 61% |
| 4 | Ok | 61% |
| 5 | Ok | 61% |
| 6 | Ok | 61% |
| 7 | Ok | 41% |
| 8 | Ok | 41% |
| 9 | Ok | 41% |
| 10 | Ok | 41% |
| PowerSupply1 | Ok | 91% |
| PowerSupply2 | Ok | 91% |
| PowerSupply3 | Ok | 91% |
| PowerSupply4 | Ok | 91% |

An example CLI output showing information on fan status and speed
nfc423 (s1) #show system environment cooling
System cooling status is: Ok
Ambient temperature: 29 C
Airflow: port-side intake
Number of cooling zones is: 1
Configured number of cooling zones is: 2
Config Actual Speed Stable
Fan Status Speed Speed Uptime Stability Uptime
1/1 Ok 38% 378 1:09:35 Stable 1:08:45
1/2 Ok 38% 37% 1:09:35 Stable 1:08:45
1/3 Ok 38% 37% 1:09:35 Stable 1:08:45
1/4 Ok 38% 37% 1:09:35 Stable 1:08:45
1/5 Ok 38% 37% 1:09:35 Stable 1:08:45
1/6 Ok 38% 37% 1:09:35 Stable 1:08:45
1/7 Ok 38% 37% 1:09:35 Stable 1:08:45
1/8 Ok 38% 37% 1:09:35 Stable 1:08:45
2/1 Ok 38% 38% 1:09:34 Stable 1:08:45
2/2 Ok 38% 37% 1:09:34 Stable 1:08:45
2/3 Ok 38% 38% 1:09:34 Stable 1:08:45
2/4 Ok 38% 37% 1:09:34 Stable 1:08:45
2/5 Ok 38% 37% 1:09:34 Stable 1:08:45
2/6 Ok 38% 37% 1:09:34 Stable 1:08:45
2/7 Ok 38% 37% 1:09:34 Stable 1:08:45
2/8 Ok 38% 37% 1:09:34 Stable 1:08:45
3/1 Ok 38% 37% 1:09:35 Stable 1:08:45
3/2 Ok 38% 37% 1:09:35 Stable 1:08:45
3/3 Ok 38% 37% 1:09:35 Stable 1:08:45
5/1 Ok 38% 37% 1:09:37 Stable 1:08:45
5/2 Ok 38% 37% 1:09:37 Stable 1:08:45
5/3 Ok 38% 37% 1:09:37 Stable 1:08:45
5/4 Ok 38% 37% 1:09:37 Stable 1:08:45
5/5 Ok 38% 37% 1:09:37 Stable 1:08:45
5/6 Ok 38% 37% 1:09:37 Stable 1:08:45
5/7 Ok 38% 37% 1:09:37 Stable 1:08:45
5/8 Ok 38% 37% 1:09:37 Stable 1:08:45
6/1 Ok 38% 378 1:09:33 Stable 1:08:45
6/2 Ok 38% 38% 1:09:33 Stable 1:08:45
6/3 Ok 389 38% 1:09:33 Stable 1:08:45
6/4 Ok 38% 37% 1:09:33 Stable 1:08:45
6/5 Ok 38% 37% 1:09:33 Stable 1:08:45
6/6 Ok 38% 37% 1:09:33 Stable 1:08:45
6/7 Ok 38% 37% 1:09:33 Stable 1:08:45
6/8 Ok 38% 37% 1:09:33 Stable 1:08:45
PowerSupply1 Not Inserted N/A N/A Offline N/A N/A
PowerSupply2 Not Inserted N/A N/A Offline N/A N/A
PowerSupply3 Not Inserted N/A N/A Offline N/A N/A
PowerSupply4/1 Ok 70% 70% 1:09:36 Stable 1:09:01
PowerSupply5/1 Ok 70% 70% 1:09:36 Stable 1:09:01

Example Network Device Hardware

Figure 8:
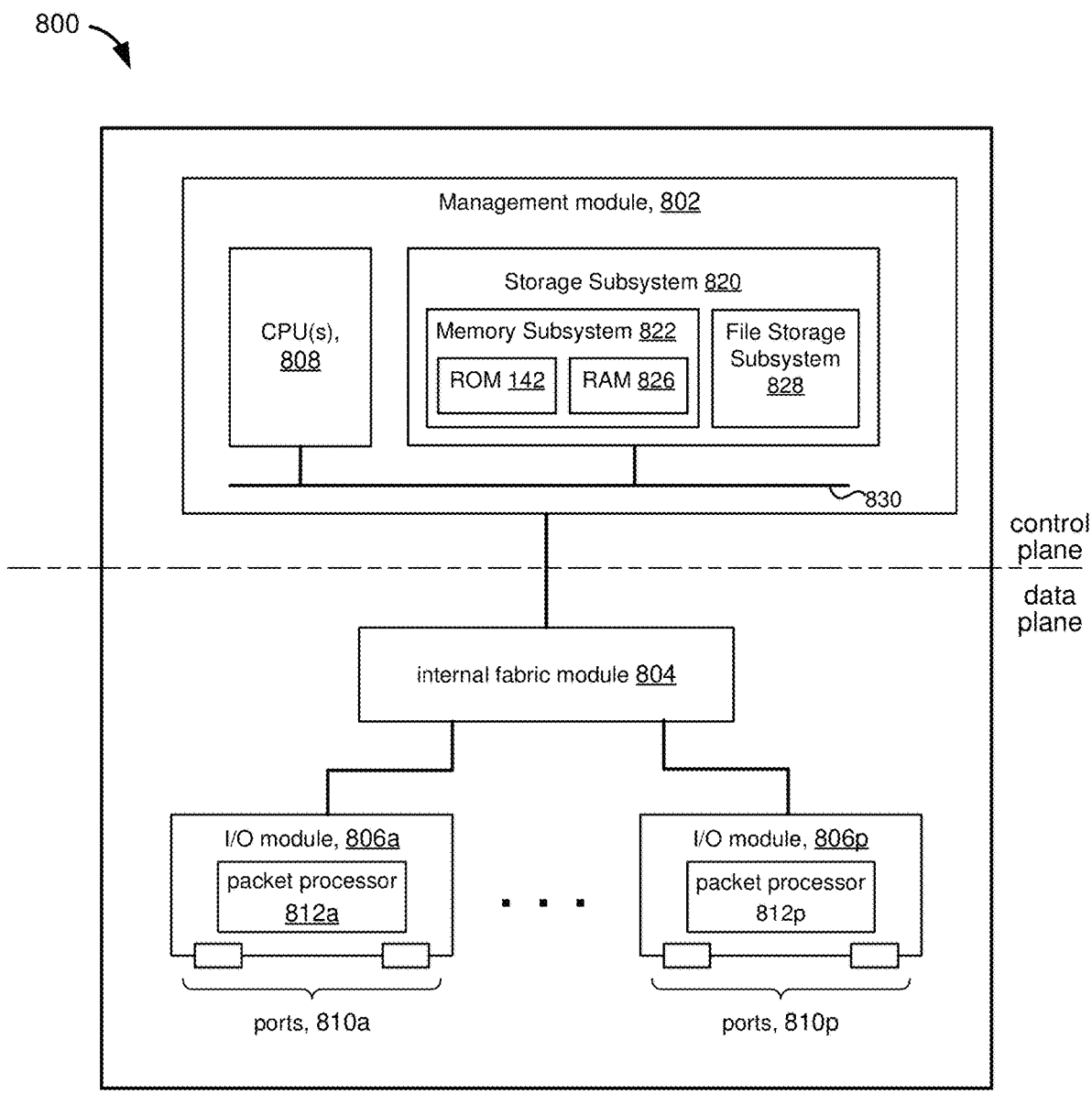
FIG. 8 illustrates a network switch device 800 that can be adapted according to one or more embodiments of the present disclosure.

FIG. 8 illustrates a network switch device 800 that can be adapted according to one or more embodiments of the present disclosure. The network switch device 800 may be a switch or a router, for example. As shown, network switch device 800 can include a management module 802, an internal fabric module 804, and a number of I/O modules 806a-806p. The management module 802 may be disposed in a control plane (also referred to as control layer) of the network switch device 800 and can include one or more management CPUs 808 for managing and controlling operation of network switch device 800 in accordance with the present disclosure. Each management CPU 808 can be a general purpose processor, such as an Intel®/AMD® x86-64 or ARM® processor, that operates under the control of software stored in memory, such as a storage subsystem 820, which may include read-only memory 828 and/or random access memory 826. In some embodiments, the CPU 808 may include control circuitry, and may include or be coupled to a non-transitory storage medium storing encoded instructions that cause the CPU 808 to perform operations described herein. In some embodiments, the non-transitory storage medium may include encoded logic or hardwired logic for controlling operation of the CPU 808. The control plane refers to all the functions and processes that determine which path to use, such as routing protocols, spanning tree, and the like.

Internal fabric module 804 and I/O modules 806a-806p collectively represent the data plane of network switch device 800 (also referred to as data layer, forwarding plane, etc.). Internal fabric module 804 is configured to interconnect the various other modules of network switch device 800. Each I/O module 806a-806p includes one or more input/output ports 810a-810p that are used by network switch device 800 to send and receive network packets. Each I/O module 806a-806p can also include a packet processor 812a-812p. Each packet processor 812a-812p can comprise a forwarding hardware component configured to make wire speed decisions on how to handle incoming (ingress) and outgoing (egress) network packets. In some embodiments, the forwarding hardware can comprise an application specific integrated circuit (ASIC), a field programmable array (FPGA), a digital processing unit, or other such collection of configured logic.

In the above description, for purposes of explanation, numerous examples and specific details are set forth in order to provide a thorough understanding of the present disclosure. Such examples and details are not to be construed as unduly limiting the elements of the claims or the claimed subject matter as a whole. It will be evident, based on the language of the different claims, that the claimed subject matter may include some or all of the features in these examples, alone or in combination, and may further include modifications and equivalents of the features and techniques described herein. While certain elements may be depicted as separate components, in some instances one or more of the components may be combined into a single device or system. Likewise, although certain functionality may be described as being performed by a single element or component within the system, the functionality may in some instances be performed by multiple components or elements working together in a functionally coordinated manner. In addition, hardwired circuitry may be used independently or in combination with software instructions to implement the techniques described in this disclosure. The described functionality may be performed by custom hardware components containing hardwired logic for performing operations, or by any combination of computer hardware and programmed computer components. The embodiments described in this disclosure are not limited to any specific combination of hardware circuitry or software. The embodiments can also be practiced in distributed computing environments where operations are performed by remote data processing devices or systems that are linked through one or more wired or wireless networks. Furthermore, the terms "first," "second," "third," "fourth," etc., used herein do not necessarily indicate an ordering or sequence unless indicated. These terms may merely be used for differentiation between different objects or elements without specifying an order. The terms "component," "process," "unit," and "module" may refer to a hardware circuit or to a set of program code or instructions.

Additional Embodiments

Additional embodiments are described below.

Some embodiments provide a network switch device including a housing. The network switch device further includes The network switch device further includes a circuit board positioned within the housing. The network switch device further includes a first cooling fan operable to provide a first airflow through a first zone within the housing and across a first portion of the circuit board positioned within the first zone. The network switch device further includes a second cooling fan operable to provide a second airflow through a second zone of the housing and across a second portion of the circuit board positioned within the second zone, where the first zone separates from the second zone. The network switch device further includes a first baffle positioned between the first zone and the second zone and positioned across the circuit board. The first baffle is also configured to direct the first airflow away from the second zone and configured to direct the second airflow away from the first zone.

In some embodiments of the network switch device, the device further includes a power supply unit comprising a power supply cooling fan. The power supply unit is positioned in a power supply zone within the housing. The power supply cooling fan is operable to provide a power supply airflow through the power supply zone of the housing. The power supply zone is separate from the first zone and separate from the second zone. In some embodiments the network switch device further includes a power supply baffle positioned between the power supply zone and the second zone, where the power supply baffle is configured to direct the power supply airflow away from the second zone.

In some embodiments of the network switch device, the circuit board is a fabric card and the network switch device further includes a first line card electrically coupled to the fabric card and positioned within the first zone and the network switch device further includes a second line card electrically coupled to the fabric card and positioned within the second zone.

In some embodiments of the network switch device it further includes a third line card, a third cooling fan, and a second baffle. The third line card is electrically coupled to the fabric card and positioned in a third zone within the housing. The third zone is separate from the first zone and separate from the second zone. The third cooling fan is operable to provide a third airflow through the third zone and across a third portion of the circuit board positioned within the third zone. The second baffle is positioned between the second zone and the third zone and positioned across the circuit board. The second baffle is configured to direct the third airflow away from the second zone and configured to direct the second airflow away from the third zone.

In some embodiments the network switch device comprises a second fabric card positioned in the housing. The network switch device further includes a third cooling fan operable to provide a third airflow through a third zone within the housing and across a first portion of the second fabric card positioned within the third zone. The third zone is separate from the first zone and separate from the second zone. The network switch device further includes a second baffle positioned between the second zone and the third zone and positioned across the circuit board. The second baffle is configured to direct the third airflow away from the second zone and configured to direct the second airflow away from the third zone. The network switch device further includes a fourth cooling fan operable to provide a fourth airflow through a fourth zone within the housing and across a second portion of the second fabric card positioned within the fourth zone. The fourth zone is separate from the first zone, separate from the second zone, and separate from the third zone. The network switch device further includes a third baffle positioned between the third zone and the fourth zone and positioned across the second fabric card. The third baffle is configured to direct the third airflow away from the fourth zone and configured to direct the fourth airflow away from the third zone.

In some embodiments of the network switch device, the circuit board is a first line card and the network switch device further includes a fabric card electrically coupled to the first line card.

In some embodiments of the network switch device, the baffle includes a first baffle portion mounted to the housing and a second baffle portion mounted to the circuit board.

In some embodiments of the network switch device, the first cooling fan and the second cooling fan are electrically coupled to the circuit board.

In some embodiments, the network switch device further includes a first temperature sensor positioned in the first zone and a second temperature sensor positioned in the second zone.

In some embodiments, the network switch device further includes a first supervisor card configured to read the first temperature sensor and adjust a first fan speed of the first cooling fan based on a first reading of the first temperature sensor. The first supervisor card is configured to read the second temperature sensor and adjust a second fan speed of the second cooling based on a second reading of the second temperature sensor.

Some embodiments provide a computer implemented method. The method includes operating, by a network switch device, a first cooling fan at a first fan speed to provide a first airflow through a first zone within a housing of the network switch device and to provide the first airflow across a first portion of a circuit board positioned within the first zone. The method also includes operating, by a network switch device, a second cooling fan at a second fan speed to provide a second airflow through a second zone of the housing and across a second portion of the circuit board positioned within the second zone. The first fan speed is different from the second fan speed. The first zone is separate from the second zone. The network switch device comprises a first baffle positioned between the first zone and the second zone and positioned across the circuit board. The first baffle is configured to direct the first airflow away from the second zone and configured to direct the second airflow away from the first zone.

In some embodiments of the method, the network switch device further comprises a power supply unit including a power supply cooling fan and the method further includes operating, by the network switch device, the power supply cooling fan of the power supply unit, where the operating of the power supply cooling fan provides a power supply airflow through a power supply zone of the housing. The power supply zone is separate from the first zone and separate from the second zone. The power supply unit is positioned in the power supply zone within the housing. The network switch device comprises a power supply baffle positioned between the power supply zone and the second zone, where the power supply baffle is configured to direct the power supply airflow away from the second zone.

In some embodiments of the method, the circuit board is a fabric card and the network switch device further comprises a first line card electrically coupled to the fabric card and positioned within the first zone. The network switch device further comprises a second line card electrically coupled to the fabric card and positioned within the second zone.

In some embodiments of the method, the network switch device further comprises a third line card electrically coupled to the fabric card and positioned in a third zone within the housing. The third zone is separate from the first zone and separate from the second zone. The network switch device comprises a second baffle positioned between the second zone and the third zone and positioned across the circuit board. In such embodiments the method may further include operating, by the network switch device, a third cooling fan to provide a third airflow through the third zone and across a third portion of the circuit board positioned within the third zone. The second baffle is configured to direct the third airflow away from the second zone and configured to direct the second airflow away from the third zone.

In some embodiments of the method, the network switch device further comprises a second fabric card positioned partially in a third zone within the housing and positioned partially in a fourth zone within the housing. The network switch device further comprises a third baffle positioned between the third zone and the fourth zone and positioned across the second fabric card. In such embodiments the method may further include operating, by the network switch device, a third cooling fan operable to provide a third airflow through the third zone and across a first portion of the second fabric card positioned within the third zone. The third zone is separate from the first zone and separate from the second zone. In such embodiments the method may further include operating, by the network switch device, a fourth cooling fan operable to provide a fourth airflow through a fourth zone within the housing and across a second portion of the second fabric card positioned within the fourth zone. The fourth zone is separate from the first zone, separate from the second zone, and separate from the third zone. The third baffle is configured to direct the third airflow away from the fourth zone and configured to direct the fourth airflow away from the third zone.

In some embodiments of the method, the circuit board is a first line card, and the network switch device further comprises a fabric card electrically coupled to the first line card.

In some embodiments of the method, the baffle includes a first baffle portion mounted to the housing and a second baffle portion mounted to the circuit board.

In some embodiments of the method, the first cooling fan and the second cooling fan are electrically coupled to the circuit board.

In some embodiments of the method, the network switch device comprises a first temperature sensor positioned in the first zone and a second temperature sensor positioned in the second zone.

In some embodiments of the method, the network switch device further comprises a first supervisor card and the method may further include determining, by the first supervisor card, a first temperature value from the first temperature sensor positioned in the first zone. In such embodiments the method may further include determining, by the first supervisor card, a second temperature value from the second temperature sensor positioned in the second zone. In such embodiments the method may further include adjusting, by the first supervisor card, the first fan speed of the first cooling fan based on the first temperature value. In such embodiments the method may further include adjusting, by the first supervisor card, the second fan speed of the second cooling fan based on the second temperature value.

Some embodiments provide a network switch device comprising a housing and a functional fabric card. The housing may be configured to mount a first tray of a first hardware fabric card. The first tray may be mounted in a first zone within the housing. The housing may be configured to mount a second tray of a second hardware fabric card. The second tray may be mounted in a second zone within the housing. The first zone is separate from the second zone. The functional fabric card may comprise the first hardware fabric card, the second hardware fabric card, and an electrical coupler configured to electrically couple the first hardware fabric card and the second hardware fabric card. The first hardware fabric card may be mounted in the first tray. The first tray may be positioned in the first zone. The first hardware fabric card may comprise a first set of one or more cooling fans operable to provide a first airflow through the first zone and across the first hardware fabric card. The second hardware fabric card may be mounted in the second tray. The second tray may be positioned in the second zone. The second hardware fabric card may comprise a second set of one or more cooling fans operable to provide a second airflow through the second zone and across the second hardware fabric card. The first tray and the second tray may be configured to direct the first airflow away from the second zone and configured to direct the second airflow away from the first zone.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A network switch device, comprising:
   a housing;
   a fabric card positioned within the housing;
   a first cooling fan operable to provide a first airflow through a first zone within the housing and across a first portion of the fabric card positioned within the first zone;
   a second cooling fan operable to provide a second airflow through a second zone of the housing and across a second portion of the fabric card positioned within the second zone, the first zone separate from the second zone;
   a first baffle positioned between the first zone and the second zone and positioned across the fabric card, the first baffle configured to direct the first airflow away from the second zone and configured to direct the second airflow away from the first zone;
   a first line card electrically coupled to the fabric card and positioned within the first zone; and
   a second line card electrically coupled to the fabric card and positioned within the second zone.

2. The network switch device of claim 1, further comprising:
   a power supply unit comprising a power supply cooling fan, the power supply unit positioned in a power supply zone within the housing, the power supply cooling fan operable to provide a power supply airflow through the power supply zone of the housing, the power supply zone separate from the first zone and separate from the second zone; and
   a power supply baffle positioned between the power supply zone and the second zone, the power supply baffle configured to direct the power supply airflow away from the second zone.

3. The network switch device of claim 1, further comprising:
   a third line card electrically coupled to the fabric card and positioned in a third zone within the housing, the third zone separate from the first zone and separate from the second zone;
   a third cooling fan operable to provide a third airflow through the third zone and across a third portion of the fabric card positioned within the third zone; and
   a second baffle positioned between the second zone and the third zone and positioned across the fabric card, the second baffle configured to direct the third airflow away from the second zone and configured to direct the second airflow away from the third zone.

4. The network switch device of claim 1, further comprising:
   a second fabric card positioned in the housing;
   a third cooling fan operable to provide a third airflow through a third zone within the housing and across a first portion of the second fabric card positioned within the third zone, the third zone being separate from the first zone and separate from the second zone;
   a second baffle positioned between the second zone and the third zone and positioned across the fabric card, the second baffle configured to direct the third airflow away from the second zone and configured to direct the second airflow away from the third zone;
   a fourth cooling fan operable to provide a fourth airflow through a fourth zone within the housing and across a second portion of the second fabric card positioned within the fourth zone, the fourth zone being separate from the first zone, separate from the second zone, and separate from the third zone; and
   a third baffle positioned between the third zone and the fourth zone and positioned across the second fabric card, the third baffle configured to direct the third airflow away from the fourth zone and configured to direct the fourth airflow away from the third zone.

5. The network switch device of claim 1, wherein the first baffle includes a first baffle portion mounted to the housing and a second baffle portion mounted to the fabric card.

6. The network switch device of claim 1, wherein the first cooling fan and the second cooling fan are electrically coupled to the fabric card.

7. The network switch device of claim 1, further comprising:
   a first temperature sensor positioned in the first zone; and
   a second temperature sensor positioned in the second zone.

8. The network switch device of claim 7, further comprising:
   a first supervisor card configured to read the first temperature sensor and adjust a first fan speed of the first cooling fan based on a first reading of the first temperature sensor, the first supervisor card configured to read the second temperature sensor and adjust a second fan speed of the second cooling based on a second reading of the second temperature sensor.

9. A computer implemented method, comprising:
   operating, by a network switch device, a first cooling fan at a first fan speed to provide a first airflow through a first zone within a housing of the network switch device and to provide the first airflow across a first portion of a fabric card positioned within the first zone; and
   operating, by a network switch device, a second cooling fan at a second fan speed to provide a second airflow through a second zone of the housing and across a second portion of the fabric card positioned within the second zone, the first fan speed different from the second fan speed, the first zone separate from the second zone, the network switch device comprising a first baffle positioned between the first zone and the second zone, and positioned across the fabric card, the first baffle configured to direct the first airflow away from the second zone and configured to direct the second airflow away from the first zone;

wherein the network switch device comprises a first line card electrically coupled to the fabric card and positioned within the first zone, and wherein the network switch device further comprises a second line card electrically coupled to the fabric card and positioned within the second zone.

10. The computer implemented method of claim 9, wherein the network switch device further comprises a power supply unit including a power supply cooling fan, the method further comprising:

operating, by the network switch device, the power supply cooling fan of the power supply unit, the operating of the power supply cooling fan providing a power supply airflow through a power supply zone of the housing, the power supply zone separate from the first zone and separate from the second zone, the power supply unit positioned in the power supply zone within the housing, the network switch device comprising a power supply baffle positioned between the power supply zone and the second zone, the power supply baffle configured to direct the power supply airflow away from the second zone.

11. The computer implemented method of claim 9, wherein the network switch device further comprises a third line card electrically coupled to the fabric card and positioned in a third zone within the housing, the third zone separate from the first zone and separate from the second zone, the network switch device comprises a second baffle positioned between the second zone and the third zone and positioned across the fabric card, and wherein the method further comprises:

operating, by the network switch device, a third cooling fan to provide a third airflow through the third zone and across a third portion of the fabric card positioned within the third zone, the second baffle configured to direct the third airflow away from the second zone and configured to direct the second airflow away from the third zone.

12. The computer implemented method of claim 9, wherein the network switch device further comprises a second fabric card positioned partially in a third zone within the housing and positioned partially in a fourth zone within the housing, wherein the network switch device further comprises a third baffle positioned between the third zone and the fourth zone and positioned across the second fabric card, and wherein the method further comprising:

operating, by the network switch device, a third cooling fan operable to provide a third airflow through the third zone and across a first portion of the second fabric card positioned within the third zone, the third zone being separate from the first zone and separate from the second zone; and operating, by the network switch device, a fourth cooling fan operable to provide a fourth airflow through a fourth zone within the housing and across a second portion of the second fabric card positioned within the fourth zone, the fourth zone being separate from the first zone, separate from the second zone, and separate from the third zone, the third baffle configured to direct the third airflow away from the fourth zone and configured to direct the fourth airflow away from the third zone.

13. The computer implemented method of claim 9, wherein the baffle includes a first baffle portion mounted to the housing and a second baffle portion mounted to the fabric card.

14. The computer implemented method of claim 9, wherein the first cooling fan and the second cooling fan are electrically coupled to the fabric card.

15. The computer implemented method claim 9, wherein the network switch device comprises a first temperature sensor positioned in the first zone and a second temperature sensor positioned in the second zone, wherein the network switch device further comprises a first supervisor card, and wherein the method further comprising:

determining, by the first supervisor card, a first temperature value from the first temperature sensor positioned in the first zone;

determining, by the first supervisor card, a second temperature value from the second temperature sensor positioned in the second zone;

adjusting, by the first supervisor card, the first fan speed of the first cooling fan based on the first temperature value; and adjusting, by the first supervisor card, the second fan speed of the second cooling fan based on the second temperature value.

16. A network switch device, comprising:

a housing configured to mount a first tray of a first hardware fabric card in a first zone within the housing, the housing further configured to mount a second tray of a second hardware fabric card in a second zone within the housing, the first zone separate from the second zone; and a functional fabric card comprising the first hardware fabric card, the second hardware fabric card, and an electrical coupler configured to electrically couple the first hardware fabric card and the second hardware fabric card, the first hardware fabric card mounted in the first tray, the first tray positioned in the first zone, the first hardware fabric card comprising a first set of one or more cooling fans operable to provide a first airflow through the first zone and across the first hardware fabric card, the second hardware fabric card mounted in the second tray, the second tray positioned in the second zone, the second hardware fabric card comprising a second set of one or more cooling fans operable to provide a second airflow through the second zone and across the second hardware fabric card, the first tray and the second tray configured to direct the first airflow away from the second zone and configured to direct the second airflow away from the first zone.

17. A network switch device, comprising:

a housing;

a first line card positioned within the housing;

a second line card positioned within the housing;

a first cooling fan operable to provide a first airflow through a first zone within the housing and across a first portion of the first and second line cards positioned within the first zone;

a second cooling fan operable to provide a second airflow through a second zone of the housing and across a second portion of the first and second line cards positioned within the second zone, the first zone separate from the second zone;
a first baffle positioned between the first zone and the second zone and positioned across the first and second line cards, the first baffle configured to direct the first airflow away from the second zone and configured to direct the second airflow away from the first zone; and
a fabric card electrically coupled to the first and second line cards, the fabric card positioned in one of the first zone and the second zone.

* * * * *